(12) United States Patent
Pan et al.

(10) Patent No.: US 11,659,686 B2
(45) Date of Patent: May 23, 2023

(54) WATER COOLING SYSTEM

(71) Applicant: KUAN DING INDUSTRIAL CO., LTD., New Taipei (TW)

(72) Inventors: Kuan-Da Pan, New Taipei (TW); Ming-Cheng Peng, New Taipei (TW)

(73) Assignee: KUAN DING INDUSTRIAL CO., LTD., New Taipei (TW)

( * ) Notice: Subject to any disclaimer, the term of this patent is extended or adjusted under 35 U.S.C. 154(b) by 147 days.

(21) Appl. No.: 17/412,048

(22) Filed: Aug. 25, 2021

(65) Prior Publication Data
US 2022/0400578 A1  Dec. 15, 2022

(30) Foreign Application Priority Data
Jun. 9, 2021 (TW) ................................. 110120943

(51) Int. Cl.
*H05K 7/20* (2006.01)
(52) U.S. Cl.
CPC ..... *H05K 7/20272* (2013.01); *H05K 7/20263* (2013.01)
(58) Field of Classification Search
CPC ... H05K 7/20272; H05K 7/20263; G06F 1/20
See application file for complete search history.

(56) References Cited

U.S. PATENT DOCUMENTS

| | | | | |
|---|---|---|---|---|
| 6,749,012 B2* | 6/2004 | Gwin | ................... | H01L 23/473 165/122 |
| 9,818,671 B2* | 11/2017 | Huang | .................. | H01L 23/467 |
| 2005/0168939 A1* | 8/2005 | Iijima | ................. | F28D 1/05375 361/679.48 |
| 2006/0021737 A1* | 2/2006 | Lee | ....................... | H01L 23/473 257/E23.098 |
| 2007/0089859 A1* | 4/2007 | Wei | ....................... | H01L 23/473 257/E23.098 |

FOREIGN PATENT DOCUMENTS

| | | | | | |
|---|---|---|---|---|---|
| CN | 201142810 Y | * | 10/2008 | | |
| KR | 100956358 B1 | * | 5/2010 | ......... | H05K 7/20263 |
| TW | M609012 U | * | 3/2021 | ........... | H01L 23/473 |

* cited by examiner

*Primary Examiner* — Emmanuel E Duke
(74) *Attorney, Agent, or Firm* — Chun-Ming Shih; HDLS IPR Services

(57) ABSTRACT

A water cooling system includes a water block, a heat radiator, a pump, a circulating conduit and a water storage assembly. The pump is disposed between the water block and the heat radiator. The circulating conduit communicates with the water block, the heat radiator and the pump. The water storage assembly is configured to be a part of an integrated element. The integrated element includes one of the water block, the heat radiator and the pump. The water storage assembly includes a liquid storage chamber and a liquid guide. The liquid storage chamber has an inner wall. An end of the liquid guide has a protrusive tube end reaching to the liquid storage chamber. The protrusive tube end protrudes from the inner wall. An angular space is formed between the protrusive tube end and the inner wall.

14 Claims, 8 Drawing Sheets

WATER COOLING SYSTEM

BACKGROUND

Technical Field

The disclosure relates to a cooling system for a computer or a calculating machine, particularly to a water cooling system.

Related Art

A water (liquid) cooling system includes a reservoir, a water block attached on a heat generating element, a pump, a heat radiator and tubing. The water block is attached on a surface of a heat generating element to implement heat exchange. The heat absorbed by the water block is delivered to the heat radiator by the flowing of working fluid. The temperature of the working fluid is lowered by heat exchange between the heat radiator and the outside cold air. Finally, the cooled working fluid flows back to the water block to accomplish the object of cooling a heat generating element.

However, the reservoir, the water block, the pump and the heat radiator must be arranged in different angles and directions depending on different positions of the heat generating element. Air may enter the pipeline and the pump when the water in the chamber is insufficient or at a low level, and the pump may extract air to cause speed reduction or blocks. In addition, the pump may be idling or damaged due to air. That may seriously affect the operating stability and dependability of the water cooling system. It is an issue to be resolved.

SUMMARY

The disclosure provides a water cooling system which makes air stay in the angular space to be separated from the working fluid when the working fluid and air flow through the liquid guide. Thus, the watering cooling system of the disclosure possesses advantages of stable operation and service life being improved.

In the embodiment of the disclosure, the disclosure provides a water cooling system, which includes a water block, a heat radiator, a pump, a circulating conduit and at least one water storage assembly. The pump is disposed between the water block and the heat radiator. The circulating conduit communicates with the water block, the heat radiator and the pump. The water storage assembly is configured to be a part of an integrated element. The integrated element includes one of the water block, the heat radiator and the pump. The water storage assembly includes a liquid storage chamber and at least one liquid guide communicating with the liquid storage chamber. An inside of the liquid storage chamber has an inner wall. An end of the liquid guide has a protrusive tube end reaching to the liquid storage chamber. The protrusive tube end protrudes from the inner wall. An angular space is formed between the protrusive tube end and the inner wall.

According to the above, each of the water block, the heat radiator and the pump is disposed with the water storage assembly. An end of the liquid guide has a protrusive tube end reaching to the liquid storage chamber, the protrusive tube end protrudes from the inner wall of the liquid storage chamber, and the angular space is formed between the protrusive tube end and the inner wall. Thus, when the working fluid is insufficient or at a low level and both the working fluid and air enter the liquid storage chamber and pass the liquid guide, air upward stays in the angular space to be separated from the working fluid as the working fluid covering the protrusive tube end. As a result, air may be prevented from entering the pump to cause blocks and the probability of occurrence of idling and damage of the pump due to air may be reduced. Therefore, the water cooling system possesses advantages of operating stability and service life being improved.

In view of this, the inventors have devoted themselves to the above-mentioned related art, researched intensively and cooperated with the application of science to try to solve the above-mentioned problems. Finally, the disclosure which is reasonable and effective to overcome the above drawbacks is provided.

DETAILED DESCRIPTION

Figure 1:
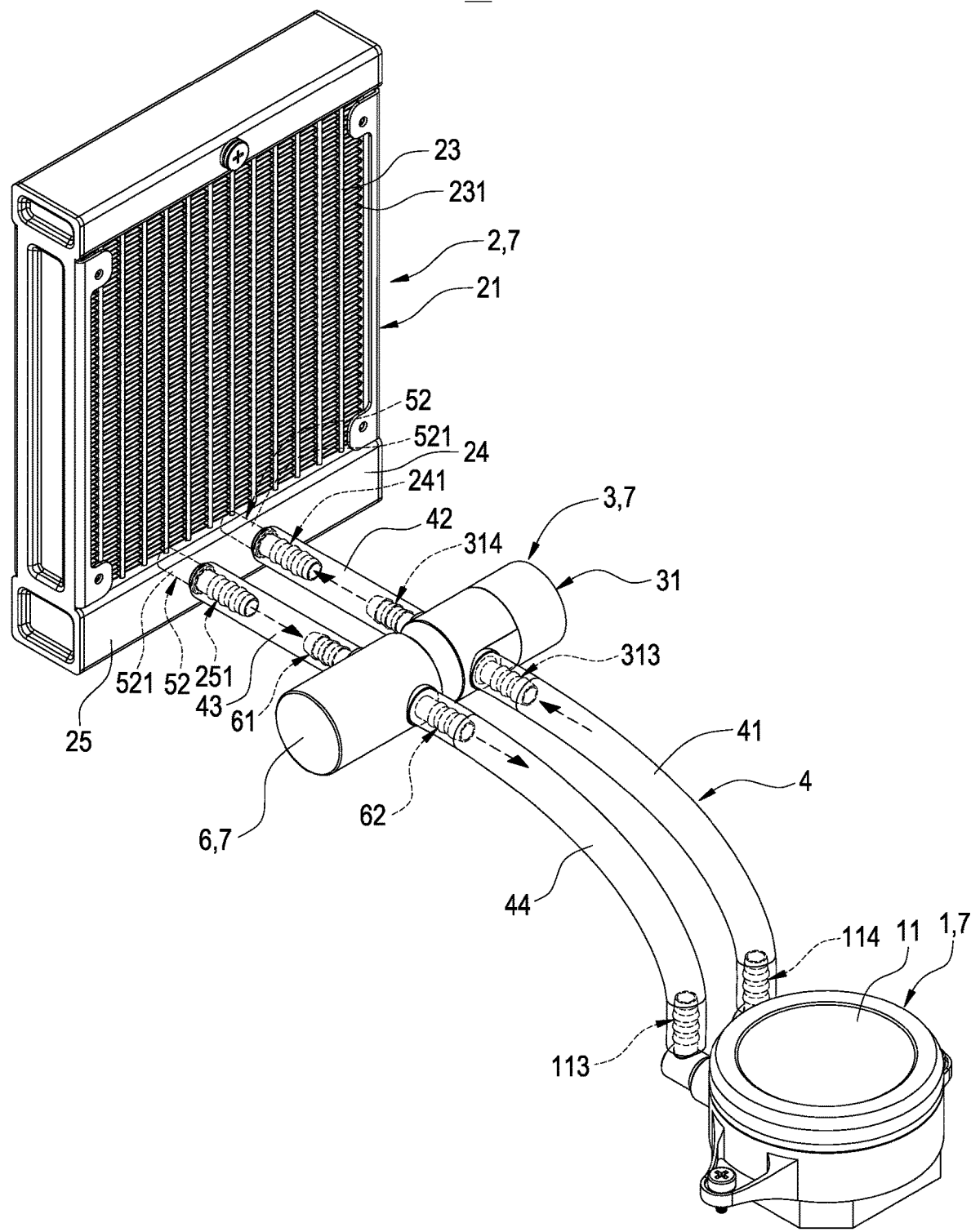
FIG. 1 is an assembled view of the water cooling system of the disclosure.

The technical contents of this disclosure will become apparent with the detailed description of embodiments accompanied with the illustration of related drawings as follows. It is intended that the embodiments and drawings disclosed herein are to be considered illustrative rather than restrictive.

Please refer to FIGS. 1-4. The disclosure provides a water cooling system, which includes a water block 1, a heat radiator 2, a pump 3, a circulating conduit 4 and one or more water storage assemblies 5.

Figure 2:
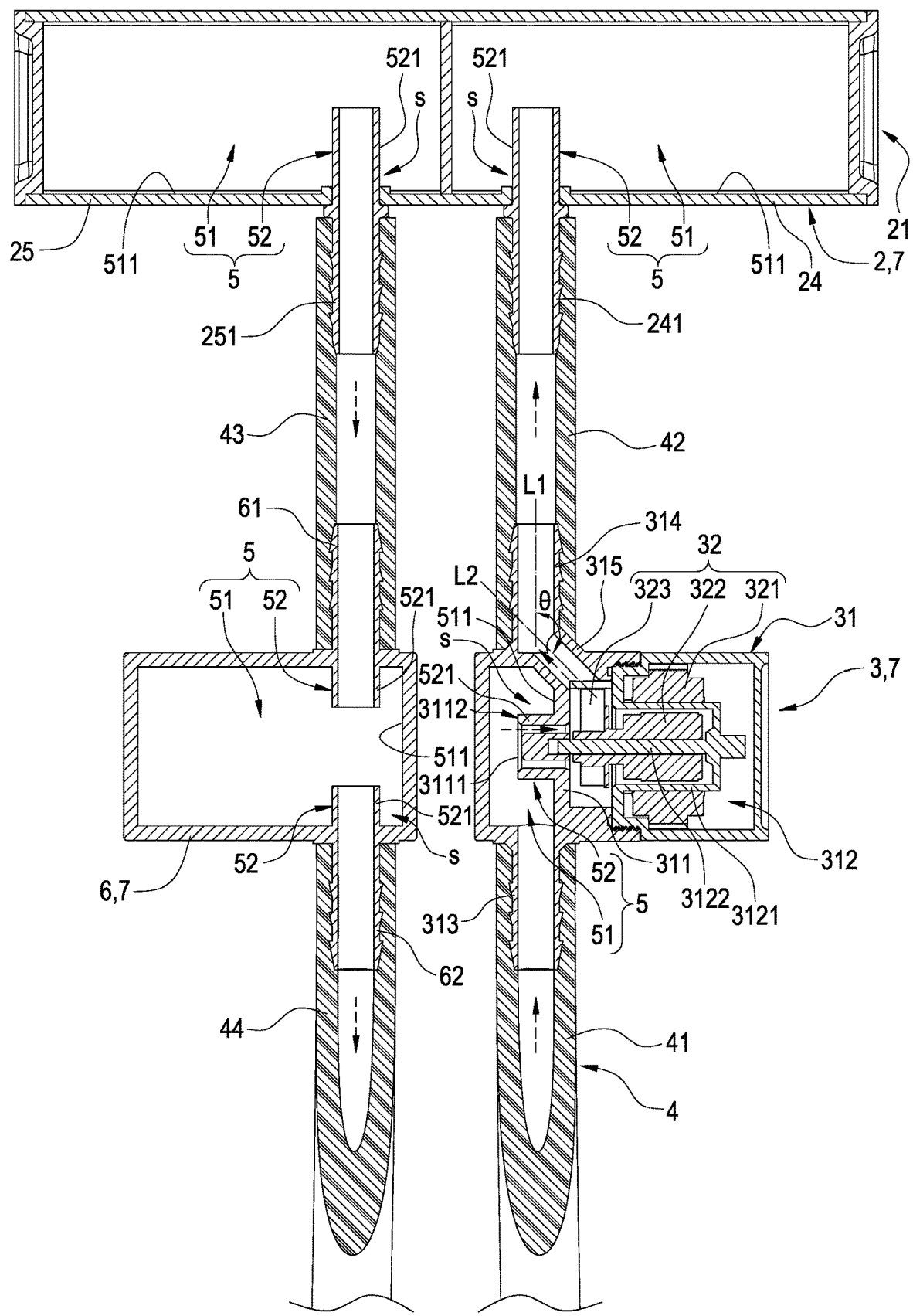
FIG. 2 is a cross-sectional view of the water cooling system of the disclosure.
Figure 4:
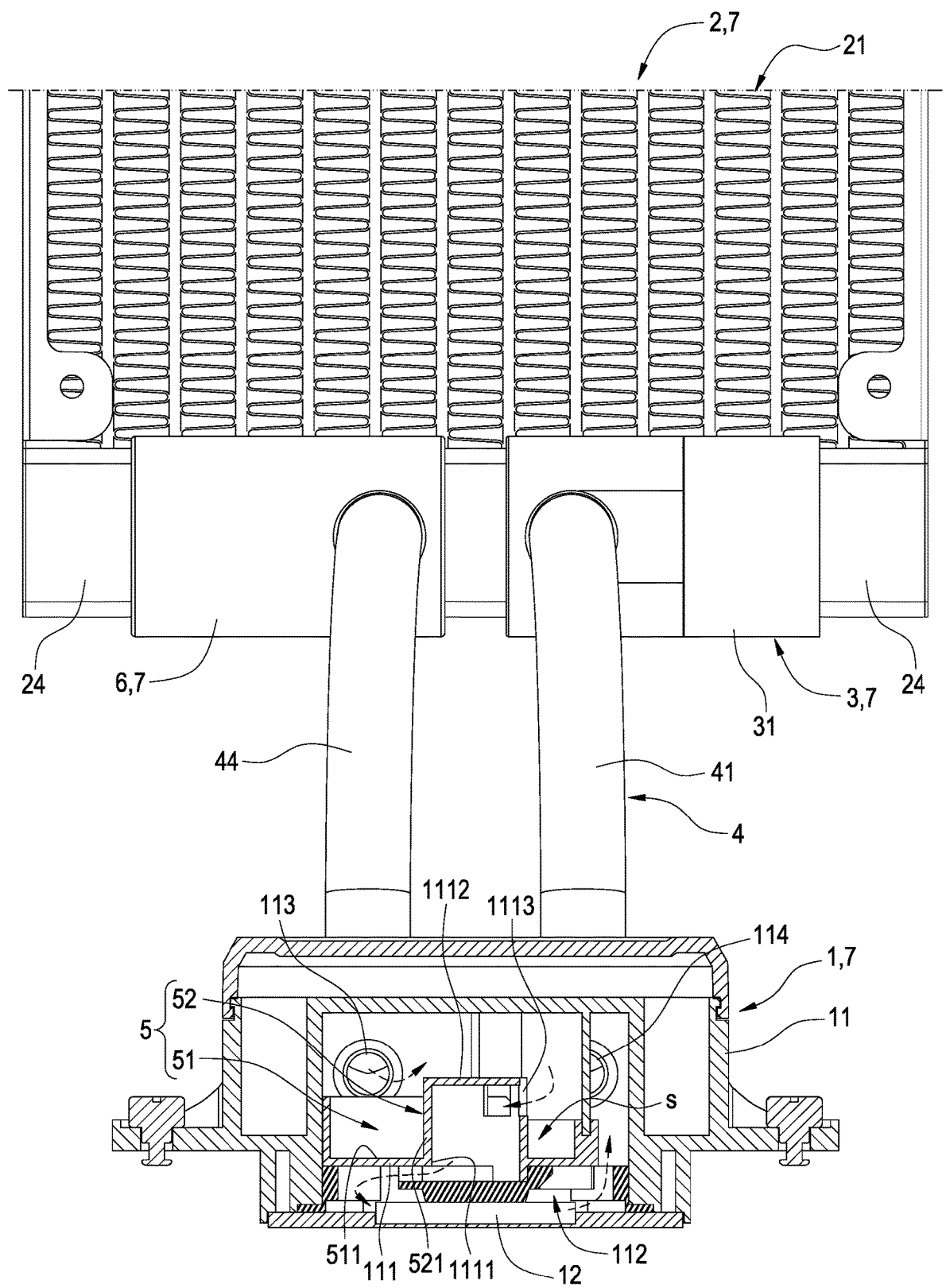
FIG. 4 is still another cross-sectional view of the water cooling system of the disclosure.

As shown in FIGS. 1, 2 and 4, the water cooling system 10 of the disclosure further includes a reservoir 6. The pump 3 and the reservoir 6 are disposed between the water block 1 and the heat radiator 2, but not limited to this.

As shown in FIGS. 1-4, the water storage assembly 5 is configured to be a part of an integrated element 7. The integrated element 7 includes one of the water block 1, the heat radiator 2, the pump 3 and the reservoir 6. The water storage assembly 5 includes a liquid storage chamber 51 and one or more liquid guides 52 communicating with the liquid storage chamber 51. An inside of the liquid storage chamber 51 has an inner wall 511. An end of the liquid guide 52 has a protrusive tube end 521 reaching to the liquid storage chamber 51. The protrusive tube end 521 protrudes from the inner wall 511. An angular space s is formed between the protrusive tube end 521 and the inner wall 511. In the embodiment, the number of the water storage assemblies 5 is multiple, but not limited thereto.

Figure 3:
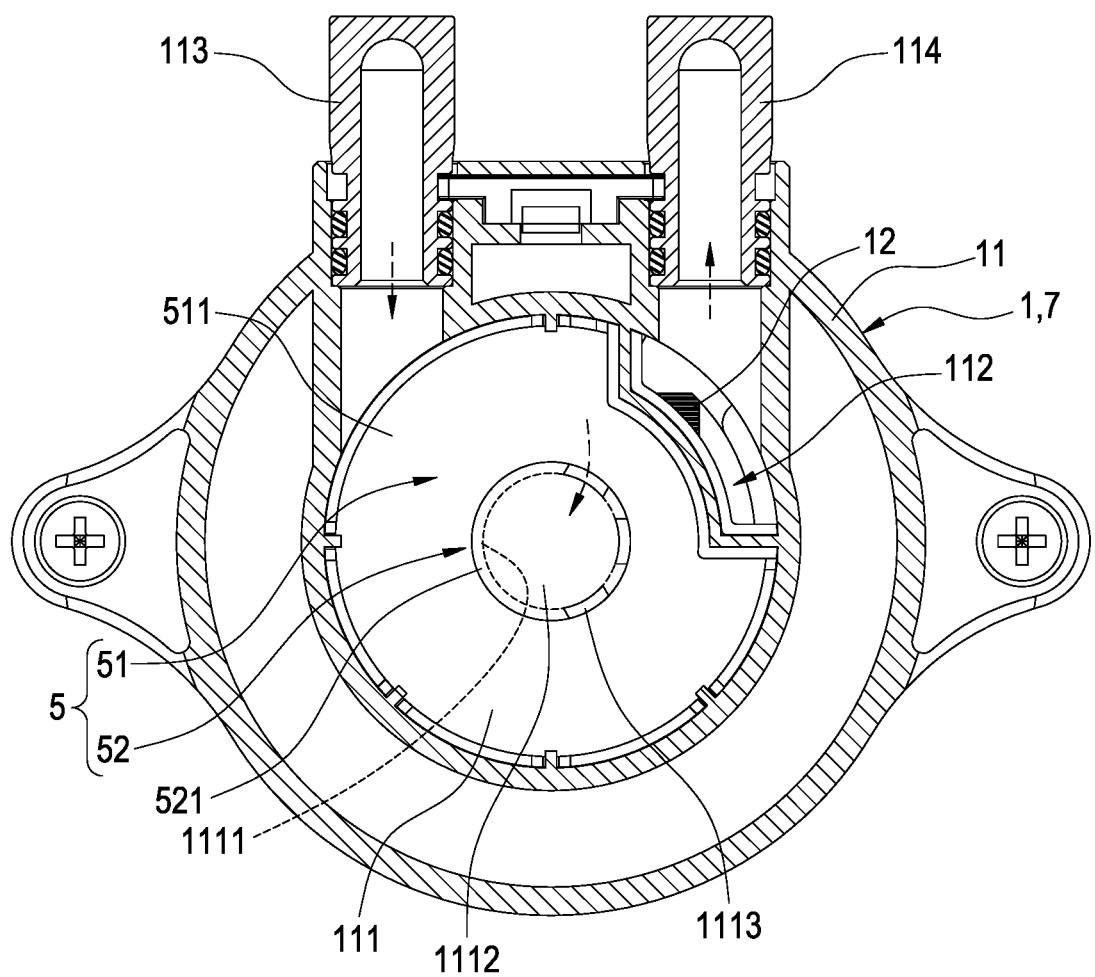
FIG. 3 is another cross-sectional view of the water cooling system of the disclosure.

As shown in FIGS. 1, 3 and 4, one of the water storage assemblies 5 is configured to be a part of the water block 1.

The water block 1 includes a water block case 11 and a cooling fin set 12. The inside of the water block case 11 has a separator 111, the liquid storage chamber 51 and a heat exchange chamber 112. The liquid storage chamber 51 is divided by the separator 111. The cooling fin set 12 is disposed in the heat exchange chamber 112.

In addition, the separator 111 is formed with an aperture 1111. The liquid guide 52 is a cover 1112 projecting from the separator 111 toward the liquid storage chamber 51 and covering a periphery of the aperture 1111. The cover 1112 is formed with multiple via holes 1113.

Furthermore, the outside of the water block case 11 has a first water inlet tube 113 communicating with the liquid storage chamber 51 and a first water outlet tube 114 communicating with the heat exchange chamber 112.

As shown in FIGS. 1, 2 and 4, another water storage assembly 5 is configured to be a part of the heat radiator 2. The heat radiator 2 includes a heat radiator case 21. The heat radiator case 21 includes multiple heat exchange passages 23, a liquid input room 24 and a liquid output room 25. The liquid input room 24 and the liquid output room 25 communicate with the heat exchange passages 23. The outsides of the heat exchange passages 23 are extended with multiple cooling fins 231.

The water storage assemblies 5 of the heat radiator 2 are two in number. One of the liquid storage chambers 51 is formed in the liquid input room 24. The liquid guide 52 is a second water inlet tube 241 projecting from the liquid input room 24 inward and outward.

Another liquid storage chamber 51 is formed in the liquid output room 25. The liquid guide 52 is a second water outlet tube 251 projecting from the liquid output room 25 inward and outward.

As shown in FIGS. 1, 2 and 4, still another water storage assembly 5 is configured to be a part of the pump 3. The pump 3 includes a pump case 31 and a pump assembly 32. The inside of the pump case 31 has a partition 311, the liquid storage chamber 51 and a pump receiving chamber 312. The liquid storage chamber 51 is divided by the partition 311. The pump assembly 32 is received in the pump receiving chamber 312.

The partition 311 is formed with a through hole 3111. The liquid guide 52 is a hollow tube 3112 projecting from the partition 311 toward the liquid storage chamber 51 and surrounding a periphery of the through hole 3111.

The pump assembly 32 includes a stator 321, a rotor 322 arranged corresponding to the stator 321 and an impeller 323 driven by the rotor 322 to rotate. The pump receiving chamber 312 has a shading bottom plate 3121 used for separating the stator 321 and the rotor 322. The shading bottom plate 3121 is extended with a shaft 3122 passing and connected with the rotor 322 and the through hole 3111.

The outside of the pump case 31 has a third water inlet tube 313 communicating with the liquid storage chamber 51 and a third water outlet tube 314 communicating with the pump receiving chamber 312.

The inside of the pump case 31 has a slant guiding passage 315 separated by the partition 311. One end of the slant guiding passage 315 communicates with the pump receiving chamber 312 and another end of the slant guiding passage 315 communicates with the third water outlet tube 314. An angle θ between the axis L1 of the third water outlet tube 314 and the axis L2 of the slant guiding passage 315 is between 120 degrees and 150 degrees.

As shown in FIGS. 1, 2 and 4, yet another water storage assembly 5 is configured to be a part of the reservoir 6. The liquid storage chamber 51 is formed in the reservoir 6. The liquid guides 52 are two in number. The two liquid guides 52 are a fourth water inlet tube 61 and a fourth water outlet tube 62, which project from the reservoir 6 inward and outward.

As shown in FIGS. 1, 2 and 4, the circulating conduit 4 communicates with the water block 1, the heat radiator 2, the pump 3 and the reservoir 6. The heat exchange chamber 112 is used to be attached on a heat generating element (not shown). After the cooling fin set 12 absorbs the heat from the heat generating element (not shown), the cooling fin set 12 transfers the heat to the working fluid. The heated working fluid flows along the circulating conduit 4 to the heat radiator 2 through the water block 1 and the pump 3. The cooling fins 231 of the heat exchange passages 23 transfer the heat to the outside to cool the working fluid. Finally, the circulating conduit 4 guides the cooled working fluid back to the water block 1 through the heat radiator 2 and the reservoir 6 to finish a heat circulating cycle to cool the heat generating element (not shown).

In detail, the circulating conduit 4 of the embodiment includes a first conduit 41 adapted to sheathe the first water outlet tube 114 and the third water inlet tube 313, a second conduit 42 adapted to sheathe the third water outlet tube 314 and the second water inlet tube 241, a third conduit 43 adapted to sheathe the second water outlet tube 251 and the fourth water inlet tube 61 and a fourth conduit 44 adapted to sheathe the fourth water outlet tube 62 and the first water inlet tube 113.

Therefore, the working fluid flows back to the heat exchange chamber 112 through the heat exchange chamber 112, the first water outlet tube 114, the first conduit 41, the third water inlet tube 313, the liquid storage chamber 51 of the pump 3, the hollow tube 3112, the pump receiving chamber 312, the slant guiding passage 315, the third water outlet tube 314, the second conduit 42, the second water inlet tube 241, the liquid input room 24, the heat exchange passage 23, the liquid output room 25, the second water outlet tube 251, the third conduit 43, the fourth water inlet tube 61, the liquid storage chamber 51 of the reservoir 6, the fourth water outlet tube 62, the fourth conduit 44, the first water inlet tube 113, the liquid storage chamber 51 of the water block 1 and the cover 1112 in order.

As shown in FIGS. 1-4, the water cooling system 10 of the disclosure utilizes the water storage assembly 5 disposed in the water block 1, the heat radiator 2, the pump 3 and the reservoir 6. An end of the liquid guide 52 has a protrusive tube end 521 reaching to the liquid storage chamber 51, the protrusive tube end 521 protrudes from the inner wall 511 of the liquid storage chamber 51, and the angular space s is formed between the protrusive tube end 521 and the inner wall 511, so when the working fluid is insufficient or at a low level and both the working fluid and air enter the liquid storage chamber 51 and pass the liquid guide 52, air upward stays in the angular space s to be separated from the working fluid as the working fluid covering the protrusive tube end 521. As a result, air may be prevented from entering the pump 3 to cause blocks and the probability of occurrence of idling and damage of the pump 3 due to air may be reduced. Therefore, the water cooling system 10 possesses advantages of operating stability and service life being improved.

Figure 5:
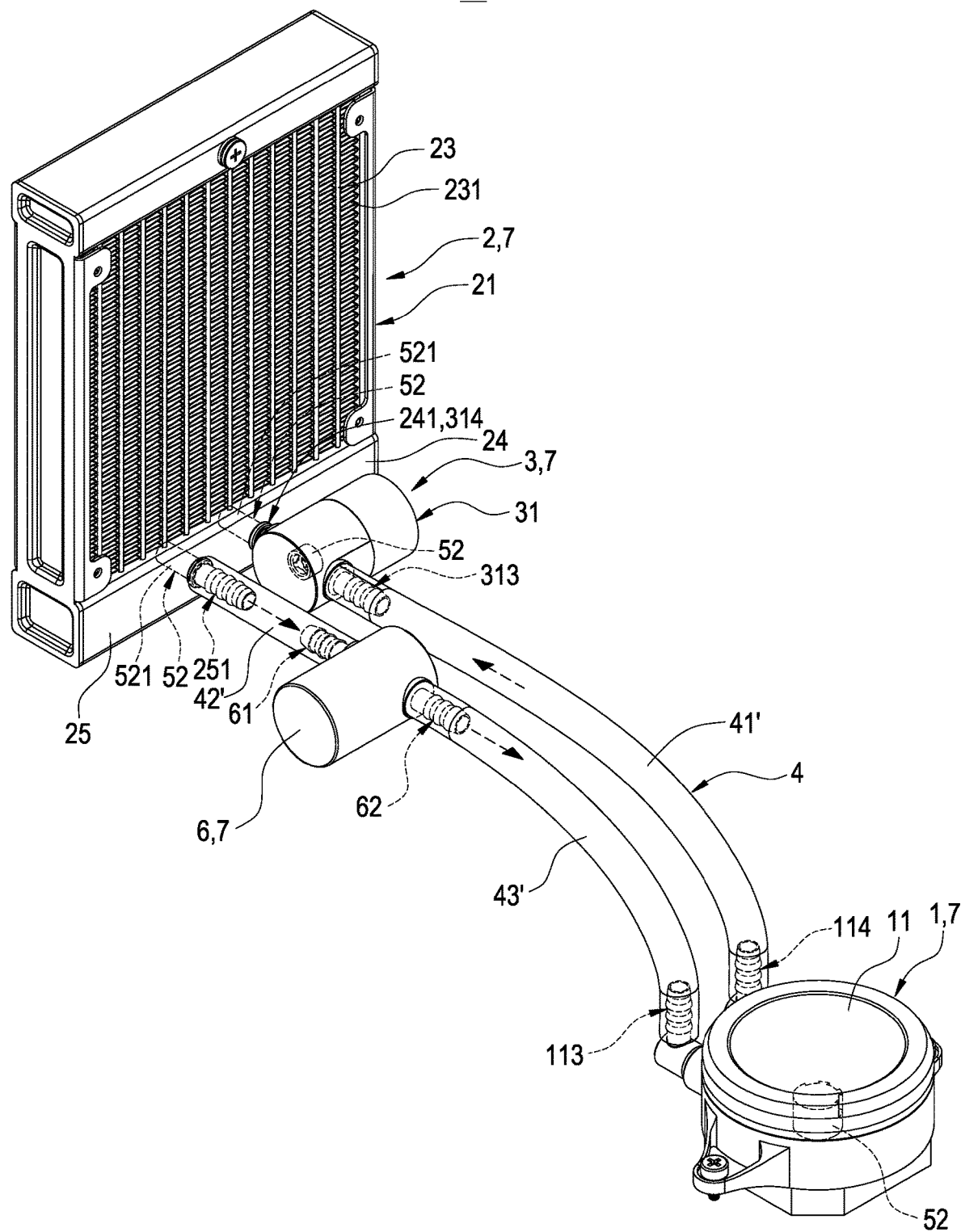
FIG. 5 is an assembled view of another embodiment of the water cooling system of the disclosure.
Figure 6:
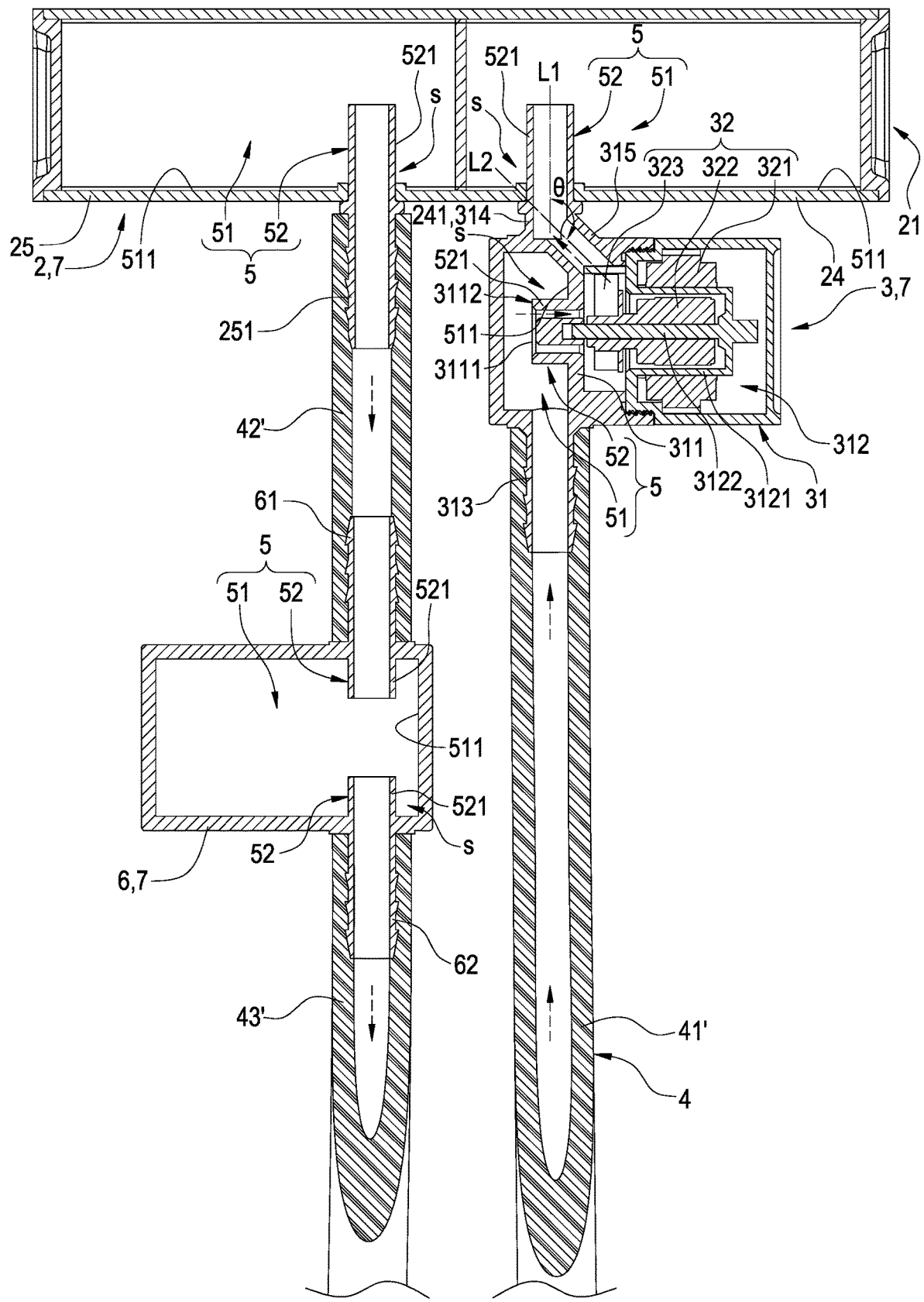
FIG. 6 is a cross-sectional view of another embodiment of the water cooling system of the disclosure.

Please refer to FIGS. 5 and 6, which show another embodiment of the water cooling system 10 of the disclosure. The embodiment of FIGS. 5 and 6 is substantially the same as the embodiment of FIGS. 1-4. The embodiment of FIGS. 5 and 6 differs from the embodiment of FIGS. 1-4 by the second water inlet tube 241 and the third water outlet tube 314 which are formed in one piece.

In detail, the second water inlet tube 241 and the third water outlet tube 314 are formed in one piece so as to make one end of the second water inlet tube 241 and the third water outlet tube 314 communicate with the water input room 24 and the other end communicate with the slant guiding passage 315.

In addition, the circulating conduit 4 of the embodiment includes a first conduit 41' adapted to sheathe the first water outlet tube 114 and the third water inlet tube 313, a second conduit 42' adapted to sheathe the second water outlet tube 251 and the fourth water inlet tube 61 and a third conduit 43' adapted to sheathe the fourth water outlet tube 62 and the first water inlet tube 113.

Therefore, the working fluid flows back to the heat exchange chamber 112 through the heat exchange chamber 112, the first water outlet tube 114, the first conduit 41', the third water inlet tube 313, the liquid storage chamber 51 of the pump 3, the hollow tube 3112, the pump receiving chamber 312, the slant guiding passage 315, the third water outlet tube 314 and the second water inlet tube 241 (the same element), the liquid input room 24, the heat exchange passage 23, the liquid output room 25, the second water outlet tube 251, the second conduit 42', the fourth water inlet tube 61, the liquid storage chamber 51 of the reservoir 6, the fourth water outlet tube 62, the third conduit 43', the first water inlet tube 113, the liquid storage chamber 51 of the water block 1 and the cover 1112 in order to accomplish the same functions and effects as those of the embodiment of FIGS. 1-4.

Also, the second water inlet tube 241 and the third water outlet tube 314 formed in one piece makes the embodiment of the water cooling system 10 further have a feature of assembling simplification.

Figure 7:
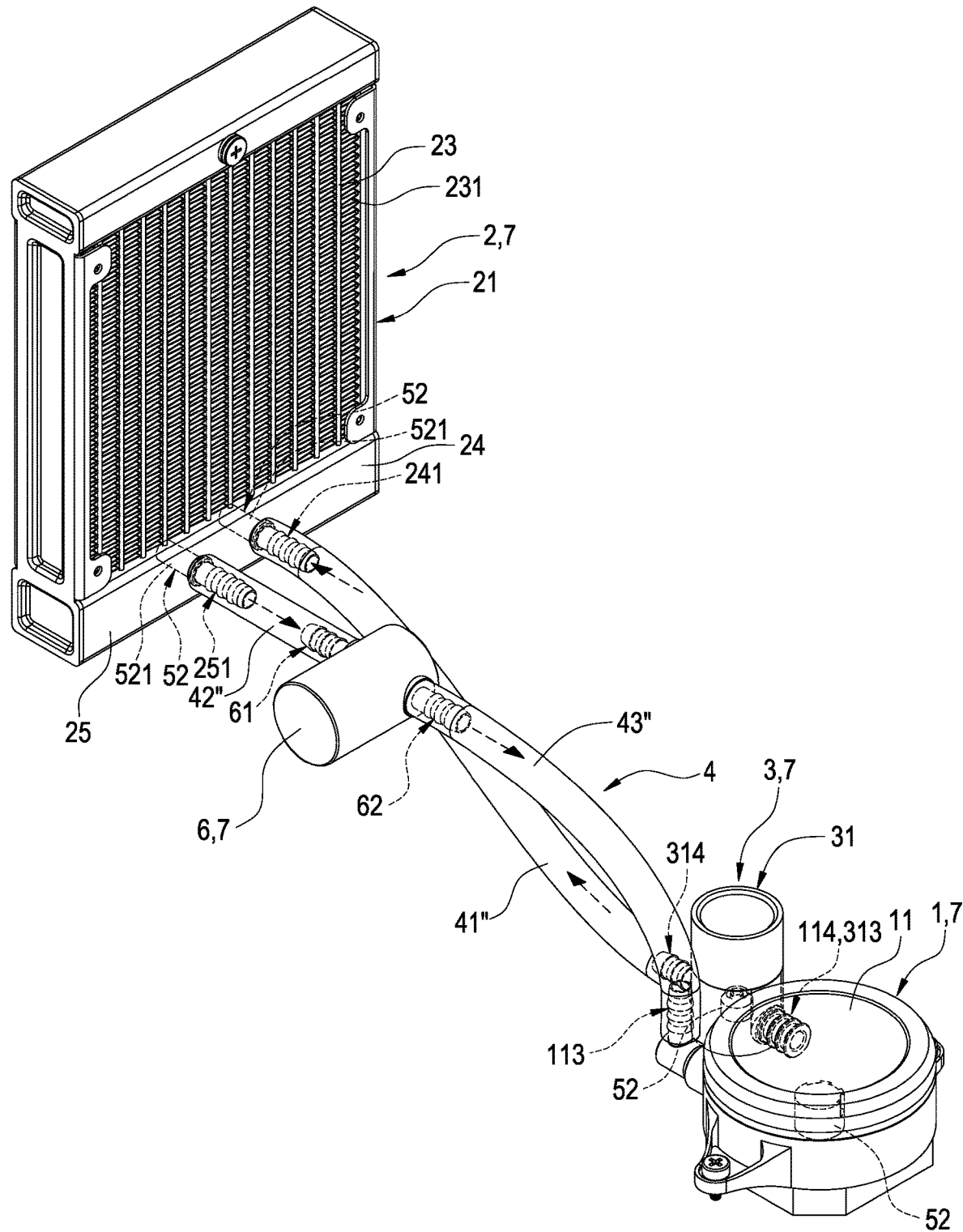
FIG. 7 is an assembled view of still another embodiment of the water cooling system of the disclosure.
Figure 8:
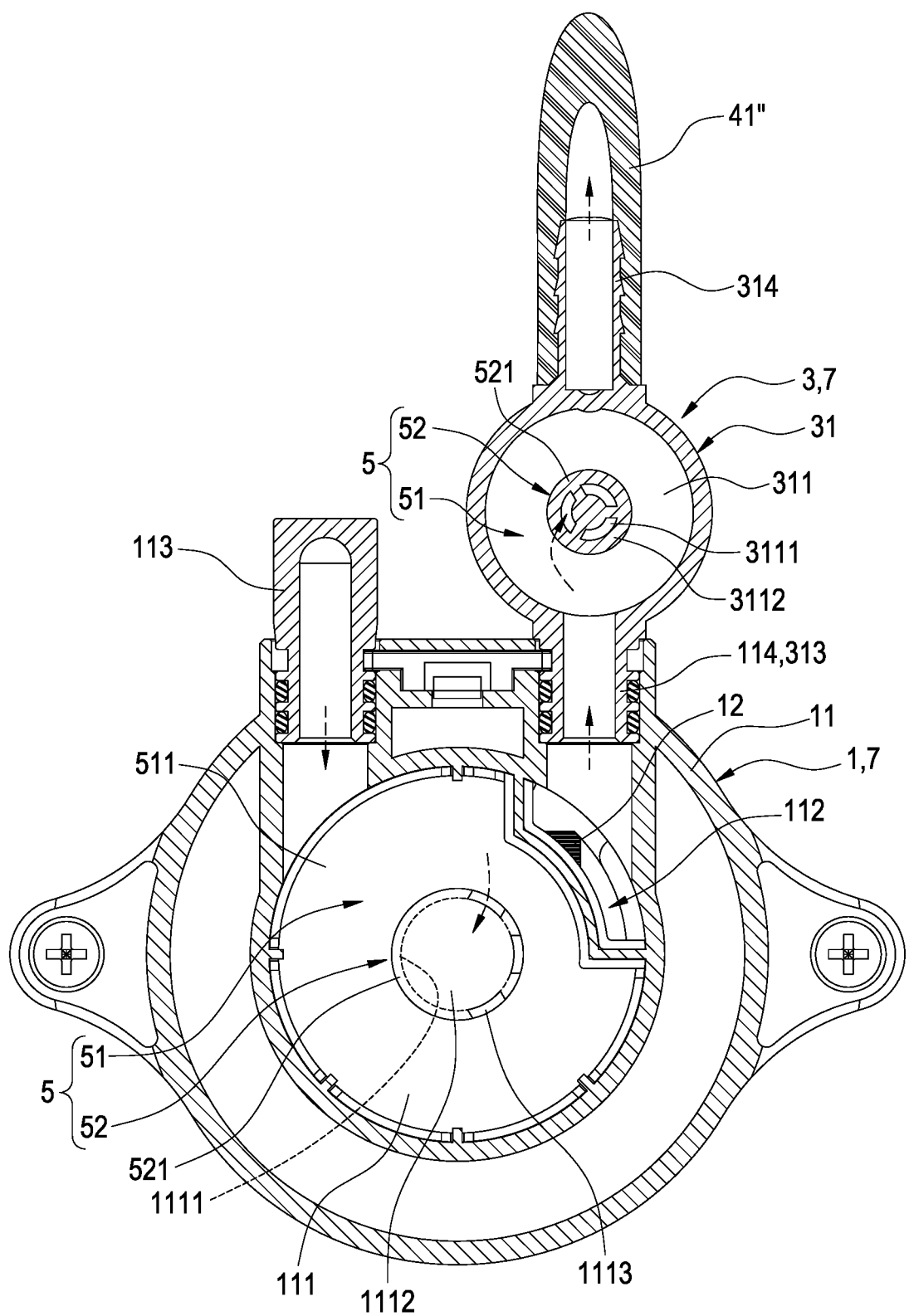
FIG. 8 is a cross-sectional view of still another embodiment of the water cooling system of the disclosure.

Please refer to FIGS. 7 and 8, which shows still another embodiment of the water cooling system 10 of the disclosure. The embodiment of FIGS. 7 and 8 is substantially the same as the embodiment of FIGS. 1-4. The embodiment of FIGS. 7 and 8 differs from the embodiment of FIGS. 1-4 by the first water outlet tube 114 and the third water inlet tube 313 which are formed in one piece.

In detail, the first water outlet tube 114 and the third water inlet tube 313 are formed in one piece so as to make one end of the first water outlet tube 114 and the third water inlet tube 313 communicates with the heat exchange chamber 112 and the other end communicates with the liquid storage chamber 51 in the pump case 31.

In addition, the circulating conduit 4 of the embodiment includes a first conduit 41" adapted to sheathe the third water outlet tube 314 and the second water inlet tube 241, a second conduit 42" adapted to sheathe the second water outlet tube 251 and the fourth water inlet tube 61 and a third conduit 43" adapted to sheathe the fourth water outlet tube 62 and the first water inlet tube 113.

Therefore, the working fluid flows back to the heat exchange chamber 112 through the heat exchange chamber 112, the first water outlet tube 114 and the third water inlet tube 313 (the same element), the liquid storage chamber 51 of the pump 3, the hollow tube 3112, the pump receiving chamber 312, the slant guiding passage 315, the third water outlet tube 314, the first conduit 41", the second water inlet tube 241, the liquid input room 24, the heat exchange passage 23, the liquid output room 25, the second water outlet tube 251, the second conduit 42", the fourth water inlet tube 61, the liquid storage chamber 51 of the reservoir 6, the fourth water outlet tube 62, the third conduit 43", the first water inlet tube 113, the liquid storage chamber 51 of the water block 1 and the cover 1112 in order to accomplish the same functions and effects as those of the embodiment of FIGS. 1-4.

Also, the first water outlet tube 114 and the third water inlet tube 313 formed in one piece makes the embodiment of the water cooling system 10 further have a feature of assembling simplification.

While this disclosure has been described by means of specific embodiments, numerous modifications and variations could be made thereto by those skilled in the art without departing from the scope and spirit of this disclosure set forth in the claims.

What is claimed is:

1. A water cooling system, comprising:
   a water block;
   a heat radiator;
   a pump, disposed between the water block and the heat radiator;
   a circulating conduit, communicating with the water block, the heat radiator and the pump; and
   at least one water storage assembly, configured to be a part of an integrated element, the integrated element comprising one of the water block, the heat radiator and the pump, the water storage assembly comprising a liquid storage chamber and at least one liquid guide communicating with the liquid storage chamber, the liquid storage chamber comprising an inner wall disposed inside, the liquid guide comprising a protrusive tube end disposed on an end thereof and reaching to the liquid storage chamber, the protrusive tube end protruding from the inner wall and configuring an angular space with the inner wall therebetween.

2. The water cooling system of claim 1, wherein the water storage assembly is configured to be a part of the water block, the water block comprises a water block case, the water block case comprises a separator, the liquid storage chamber and a heat exchange chamber disposed inside, the liquid storage chamber is divided by the separator, the separator comprises an aperture, the liquid guide comprises a cover projecting from the separator toward the liquid storage chamber and covering a periphery of the aperture, and the cover comprises multiple via holes.

3. The water cooling system of claim 2, wherein the water block further comprises a cooling fin set, disposed in the heat exchange chamber, the water block case comprises a first water inlet tube communicating with the liquid storage chamber and a first water outlet tube communicating with the heat exchange chamber disposed outside.

4. The water cooling system of claim 1, wherein the water storage assembly is configured to be a part of the heat radiator, the heat radiator comprises a heat radiator case, the heat radiator case comprises multiple heat exchange passages, a liquid input room and a liquid output room, the liquid input room and the liquid output room communicate with the heat exchange passages, and the heat exchange passages comprises multiple cooling fins extended outside.

5. The water cooling system of claim 4, wherein the liquid storage chamber is disposed in the liquid input room, and the liquid guide comprises a second water inlet tube projecting from the liquid input room inward and outward.

6. The water cooling system of claim 4, wherein the liquid storage chamber is disposed in the liquid output room, and the liquid guide comprises a second water outlet tube projecting from the liquid output room inward and outward.

7. The water cooling system of claim 1, wherein the water storage assembly is configured to be a part of the pump, the pump comprises a pump case, the pump case comprises a partition, the liquid storage chamber and a pump receiving chamber disposed inside, the liquid storage chamber is divided by the partition, the partition comprises a through hole, and the liquid guide comprises a hollow tube projecting from the partition toward the liquid storage chamber and surrounding a periphery of the through hole.

8. The water cooling system of claim 7, wherein the pump further comprises a pump assembly accommodated in the pump receiving chamber, the pump assembly comprises a stator, a rotor arranged corresponding to the stator and an impeller driven by the rotor to rotate, the pump receiving chamber comprises a shading bottom plate separating the stator and the rotor, and the shading bottom plate comprises a shaft extended therefrom and passing the rotor and the through hole.

9. The water cooling system of claim 7, wherein the pump case comprises a third water inlet tube communicating with the liquid storage chamber and a third water outlet tube communicating with the pump receiving chamber disposed outside.

10. The water cooling system of claim 9, wherein the pump case comprises a slant guiding passage disposed inside and separated by the partition, one end of the slant guiding passage communicates with the pump receiving chamber and another end of the slant guiding passage communicates with the third water outlet tube, an angle θ between the axis of the third water outlet tube and the axis of the slant guiding passage is between 120 degrees and 150 degrees.

11. The water cooling system of claim 1, further comprising: a reservoir communicating with the circulating conduit, wherein the integrated element further comprises the reservoir, the water storage assembly is configured to be a part of the reservoir, the liquid storage chamber is disposed in the reservoir, the liquid guide is two in number, and the two liquid guides comprise a fourth water inlet tube and a fourth water outlet tube project from the reservoir inward and outward.

12. The water cooling system of claim 11, wherein the water block comprises a water block case, the water block case comprises a first water inlet tube and a first water outlet tube, the heat radiator comprises a heat radiator case, the heat radiator case comprises a second water inlet tube and a second water outlet tube, the pump comprises a pump case, the pump case comprises a third water inlet tube and a third water outlet tube, and the circulating conduit comprises a first conduit adapted to sheathe the first water outlet tube and the third water inlet tube, a second conduit adapted to sheathe the third water outlet tube and the second water inlet tube, a third conduit adapted to sheathe the second water outlet tube and the fourth water inlet tube and a fourth conduit adapted to sheathe the fourth water outlet tube and the first water inlet tube.

13. The water cooling system of claim 11, wherein the water block comprises a water block case, the water block case comprises a first water inlet tube and a first water outlet tube, the heat radiator comprises a heat radiator case, the heat radiator case comprises a second water inlet tube and a second water outlet tube, the pump comprises a pump case, the pump case comprises a third water inlet tube and a third water outlet tube, the second water inlet tube and the third water outlet tube are formed in one piece, and the circulating conduit comprises a first conduit adapted to sheathe the first water outlet tube and the third water inlet tube, a second conduit adapted to sheathe the second water outlet tube and the fourth water inlet tube and a third conduit adapted to sheathe the fourth water outlet tube and the first water inlet tube.

14. The water cooling system of claim 11, wherein the water block comprises a water block case, the water block case comprises a first water inlet tube and a first water outlet tube, the heat radiator comprises a heat radiator case, the heat radiator case comprises a second water inlet tube and a second water outlet tube, the pump comprises a pump case, the pump case comprises a third water inlet tube and a third water outlet tube, the first water outlet tube and the third water inlet tube are formed in one piece, and the circulating conduit comprises a first conduit adapted to sheathe the third water outlet tube and the second water inlet tube, a second conduit adapted to sheathe the second water outlet tube and the fourth water inlet tube and a third conduit adapted to sheathe the fourth water outlet tube and the first water inlet tube.

* * * * *